United States Patent [19]
Omori et al.

[11] Patent Number: 5,313,364
[45] Date of Patent: May 17, 1994

[54] IC CARD AND METHOD OF MANUFACTURING THE IC CARD

[75] Inventors: Makoto Omori; Jun Ohbuchi; Hajime Maeda, all of Itami; Hiroshi Miura, Sanda; Tomomi Hamada, Sanda; Takeshi Uenaka, Sanda, all of Japan

[73] Assignee: Mitsubishi Denki Kabushiki Kaisha, Tokyo, Japan

[21] Appl. No.: 985,152

[22] Filed: Dec. 3, 1992

[30] Foreign Application Priority Data

Sep. 29, 1992 [JP] Japan .................................. 4-260110

[51] Int. Cl.⁵ ................................................ H05K 1/14
[52] U.S. Cl. ............................... 361/737; 361/728; 361/736; 361/752; 361/785; 439/44; 439/74; 174/260
[58] Field of Search ............... 361/380, 392, 395, 399, 361/413, 415, 728, 736, 737, 741, 748, 752, 785, 796; 439/74, 44; 174/260

[56] References Cited

U.S. PATENT DOCUMENTS

| | | | |
|---|---|---|---|
| 5,016,086 | 5/1991 | Inoue et al, | 357/74 |
| 5,031,076 | 7/1991 | Kiku | 361/424 |
| 5,038,250 | 8/1991 | Uenaka et al. | 361/395 |
| 5,121,295 | 6/1992 | Lam | 361/395 |
| 5,170,326 | 12/1992 | Meny et al. | 361/395 |
| 5,196,994 | 3/1993 | Tanuma et al. | 361/395 |

*Primary Examiner*—Leo P. Picard
*Assistant Examiner*—Young Whang
*Attorney, Agent, or Firm*—Leydig, Voit & Mayer

[57] ABSTRACT

An IC card arranged so that a connector cannot come off a frame during an assembly process in which the connector and a circuit board are accommodated in the frame and panels are thereafter attached to obverse and reverse surfaces of the frame. Projections on sides of the connector and resilient engaging/fixing hooks with oblique surfaces on the frame are engaged. As the connector is forced into the frame, the projections of the connector are brought into engagement with and temporarily deflect the engaging/fixing hooks of the frame. The connector is thereby fixed firmly on the frame.

10 Claims, 12 Drawing Sheets

IC CARD AND METHOD OF MANUFACTURING THE IC CARD

BACKGROUND OF THE INVENTION

1. Field of the Invention

This invention relates to an IC card such as a memory card used as an external memory medium for computers and a method of manufacturing IC cards.

2. Description of the Related Art

Figure 10A:
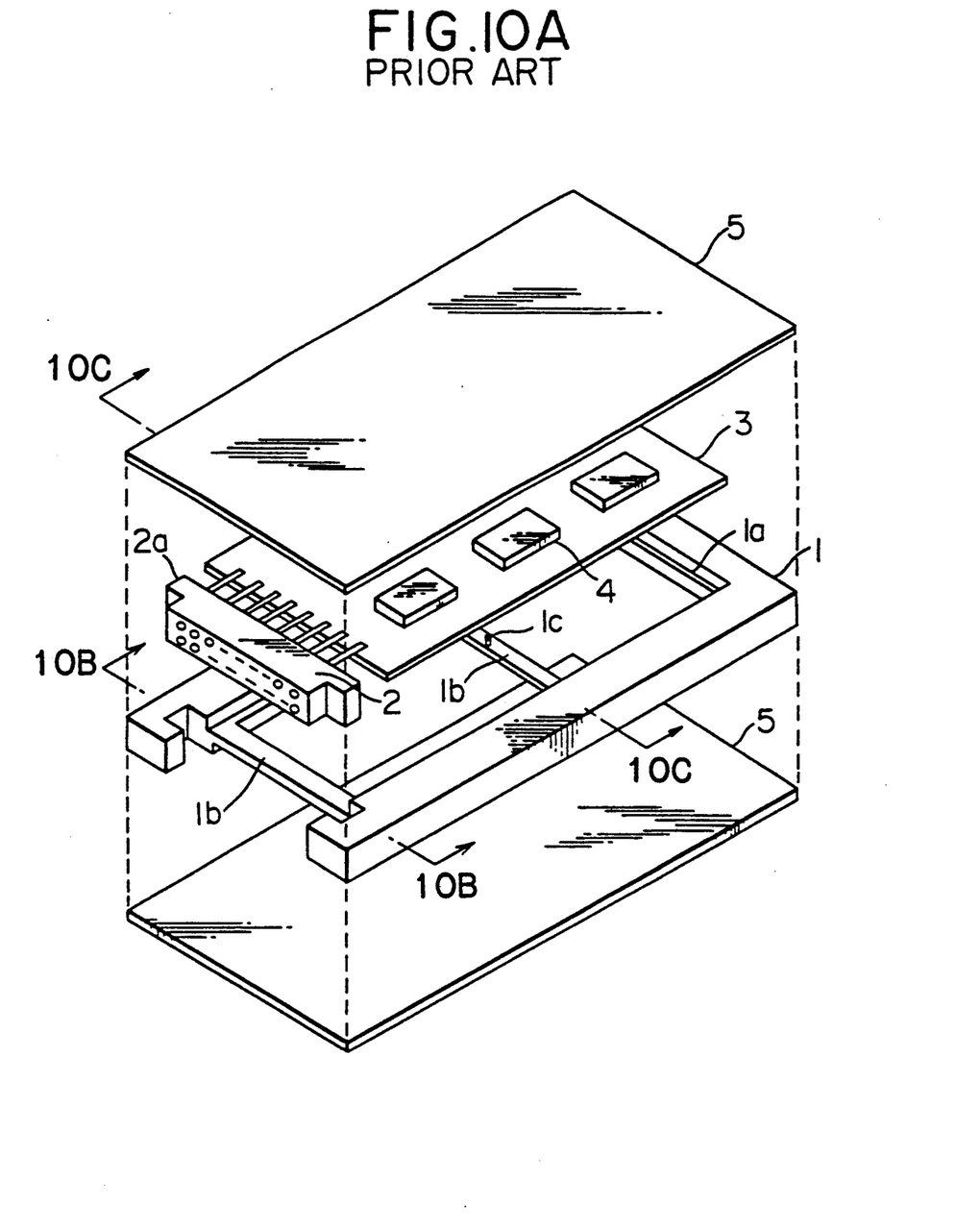
FIG. 10A is an exploded perspective view of the internal structure of a conventional IC card.
Figure 10B:
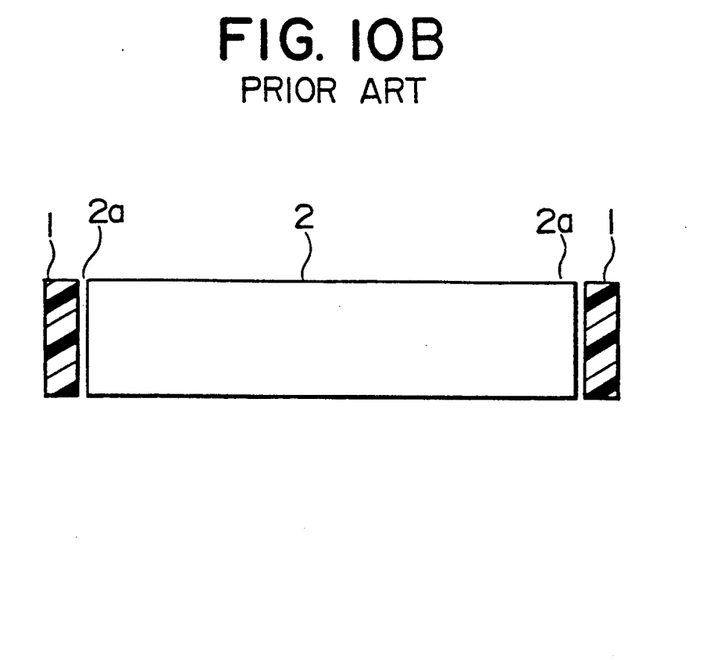
FIG. 10B is a cross-sectional view taken along the line 10B—10B of FIG. 10A.
Figure 10C:
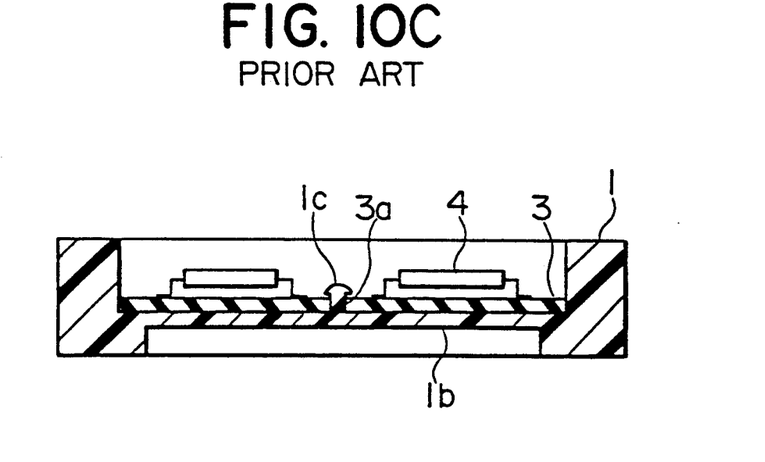
FIG. 10C is a cross-sectional view taken along the line 10C—10C of FIG. 10A.

FIGS. 10A to 10C show a conventional IC card. FIG. 10A is an exploded perspective view of an example an IC card structure, FIGS. 10B and 10C are cross-sectional views taken along the lines 10B—10B and 10C—10C of FIG. 10A. In these figures are illustrated a frame 1 having an opening, a circuit board 3 having a main surface (or two major surfaces) on which electronic parts 4, e.g., semiconductor packages, are mounted, a connector 2 for electrical connection to an external unit and soldered to the circuit board 3, and a pair of panels for closing the opening of the frame 1 on the obverse and reverse sides.

The frame 1 serves to accommodate the circuit board 3 and the connector 2 by laterally surrounding them. A support portion 1a for supporting the circuit board 3 is formed on an inner wall portion of the frame 1. Crosspieces 1b extend across the opening. The crosspieces support the circuit board 3 and to reinforce the frame 1. A caulking portion 1c is formed on one of the crosspieces 1b at the center of the frame 1. When the circuit board 3 is fitted in the opening of the frame 1, the caulking portion 1c passes through a through hole 3a formed in the circuit board 3 at the center, as shown in FIG. 10C. Then, an upper end portion of the caulking portion is deformed to fix the circuit board 3. Projections 2a are formed on side surfaces of the connector 2 on the opposite sides of an axis along the card insertion direction. The connector 2 is previously fixed by soldering on the circuit board 3. When the circuit board 3 is fitted in the frame 1, the connector 2 is also fitted in such a manner that the two side projections 2a are fitted in receiving portions 1d formed in two side portions of the frame 1. A face of the connector 2 in which a multiplicity of terminals are provided and which faces the external unit is exposed outside of the card. To avoid a reduction in manufacturing efficiency, the connector 2 and the frame 1 are fitted without being bonded to each other by an adhesive or the like. The pair of panels 5 are attached to obverse and reverse surfaces of the frame 1, for example, by an adhesive (not shown) so as to cover the connector 2 and the circuit board 3. Each of the panels 5 is formed of a metal, plastic or resin.

The process of assembling the IC card will be briefly described again. First, the circuit board 3 on which electronic parts 4 are mounted is soldered to the connector 2. Next, the circuit board 3 the connector 2 fixed to the circuit board 3 are fitted in the opening of the frame 1. Next, the panels 5 are attached to the obverse and reverse surfaces of the frame 1 by an adhesive or the like, thereby completing the IC card.

In thus-constructed conventional IC card, the connector and the frame are not bonded to each other after the frame and the circuit board have been fitted in the frame, and the projections and the receiving portions formed as shown in FIG. 10A are only fitted to each other. Accordingly, this structure entails a problem in that if the frame is warped by vibrations or impacts during the card assembly process before the panels are attached, the connector may be shifted from the proper position so as to project partially out of the frame, and something may be caught on the projecting portion so that the card comes off the transport means in the card manufacturing line. There is also a problem of occurrence of some defect during the manufacturing process. The shift of the connector mentioned above is a shift in a direction perpendicular to the card faces (a vertical direction). There is no problem with respect to a shift along a plane parallel to the card faces, since the connector is substantially fixed in corresponding directions by being fixed on the circuit board which is fixed to the frame, by being laterally pinched by the frame, and by having the projections fitted in the receiving portions of the frame.

SUMMARY OF THE INVENTION

The present invention has been achieved to solve the above-described problems, and an object of the present invention is to provide an IC card having a structure firmly and easily fixing the connector on the frame and a method of manufacturing this IC card.

To achieve this object, according to one aspect of the present invention, there is provided an IC card used by being inserted into and connected to an external unit, comprising a circuit board having a major surface on which electronic parts are mounted, at least one connector fixed on a side portion of the circuit board to establish electrical connection between the electronic parts and the external unit, a frame accommodating the circuit board and the connector by laterally surrounding them with the circuit board fixed on the frame and a face of the connector exposed, connector fixation means for fixing the connector on the frame, and a pair of panels attached to obverse and reverse surfaces of the frame so as to cover the circuit board and the connector.

According to another aspect of the Invention, the connector fixation means comprises resilient hooks respectively located on one of a pair of side portions of the connector on opposite sides of an axis along the card insertion direction and a pair of portions of the frame opposed to the connector, and engagement portions on the other one of the pairs of portions engageable with the hooks. Two or more connectors may be provided on opposite end portions or four sides side portions of the connector. Also in this case, the connector fixation means is provided for each connector.

When the connector is fitted in the frame, the hooks are temporarily bent and thereafter restored to their original shape by their elasticity while engaging the engagement portions, thereby fixing the connector on the frame and preventing the connector from shifting.

According to another aspect of the invention, the frame is resilient, and the connector fixation means comprises recesses on one of a pair of side portions of the connector on opposite sides of an axis along the card insertion direction and a pair of portions of the frame opposed to the connector, and raised portions on the other one of the pairs of portions engagable with the recesses.

In this case, when the frame is fitted in the frame, the frame is temporarily extended outwardly and then restored to its original shape by its elasticity and by the fitting between the recesses and the projections to fix the connector on the frame.

According to yet another aspect of the invention, the connector fixation means comprises projections on side portions of the connector on opposite sides of an axis along the card insertion direction, and grooves in portions of the frame opposed to the projections.

In this case, when the connector is fitted in the frame, the connector slides to fit the projections in the grooves, thereby fixing the connector on the frame and preventing the connector from shifting.

According to still another aspect of the invention, the connector fixation means comprises receiving portions in the frame, projections on side the connector fitted to the receiving portions, and an adhesive bonding the receiving portions and the projections.

In this case, the receiving portions of the frame and the projections of the connector fitted to the receiving portions are bonded by the adhesive to fix the connector on the frame, thereby preventing the connector from shifting.

According to a further aspect of the invention, the connector fixation means comprises projections in side portions of the connector on opposite sides of an axis along the card insertion direction, and deformable portions on the frame opposed to the projections.

In this case, the deformable portions are approximately perpendicularly to card faces. After fitting the connector in the frame, the opposite-side deformable portions are bent to the projections to fix the connector on the frame, thereby preventing the connector from shifting.

Further, the present invention includes a method of manufacturing an IC card comprising a step of fitting the circuit board and the connector in the frame, fixing the circuit board on the frame by caulking, and fixing the connector on the frame by the above-described connector fixation means.

In this manufacturing method, after the circuit board and the frame have been fitted in the frame, the circuit board is fixed on the frame by caulking and the connector is fixed on the frame by the connector fixation means. Thereafter, there is substantially no possibility of the connector being shifted relative to the frame.

DESCRIPTION OF THE PREFERRED EMBODIMENTS

Figure 1A:
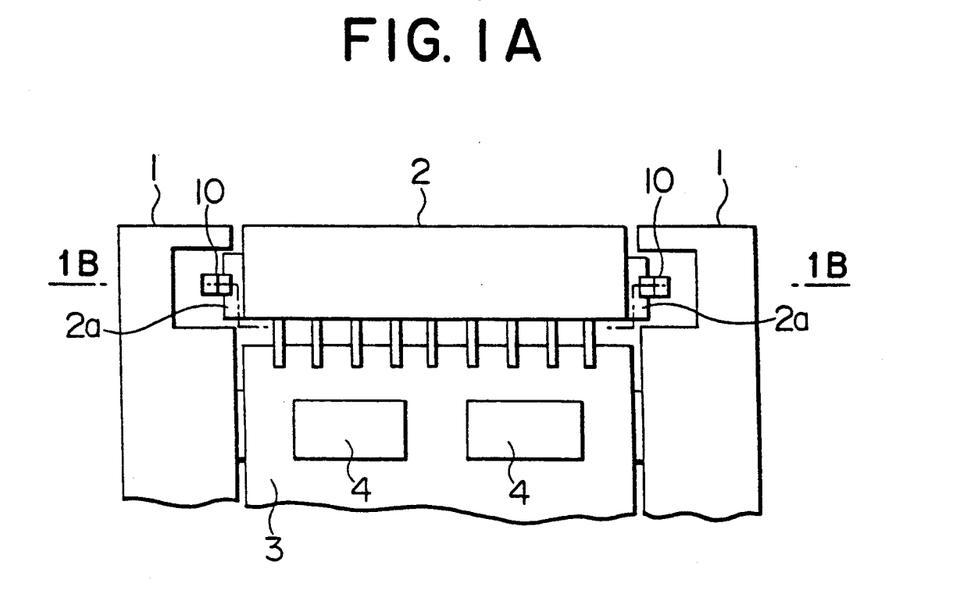
FIG. 1A is a plan view of the internal structure of a portion of an IC card in accordance with a first embodiment of the present invention.
Figure 1B:
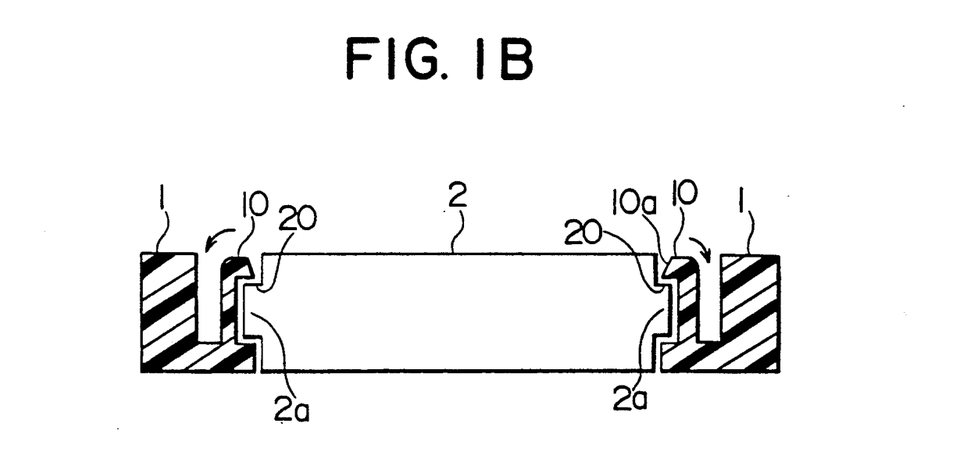
FIG. 1B is a cross-sectional view taken along the line 1B—1B of FIG. 1A.

FIG. 1A and 1B show an IC card in accordance with a first embodiment of the present invention. FIG. 1A is a plan view showing the internal construction of the card including a connector 2 and other members with panels removed), and FIG. 1B is a cross-sectional view taken along the line 1B—1B of FIG. 1A. Components identical or corresponding to those of the conventional arrangement shown in FIGS. 10A to 10C are indicated by the same reference characters in FIGS. 1A and 1B, and the description for them will not be repeated. In this, embodiment, two projections 2a are provided on respective side surfaces of the connector 2 on the opposite sides of an axis along the card insertion direction, while two L-shaped hooks 10 are located on respective inner wall portions of a frame 1 opposed to the projections 2a. Each hook 10 extends upward in the direction of thickness of card and has an extreme end portion bent toward the connector 2. Each hook 10 is resilient and can be deflected when receiving a force and is restored to its original position when the force is removed. Gaps (recesses) for receiving the projections 2a of the connector 2 and allowing the hooks 10 to be deflected are located around the hooks 10. That is, the hooks 10 are located in these recesses. Further, each hook 10 has an oblique surface 10a which enables the hook 10 to be smoothly brought into engagement with the connector 2. These recesses and the hooks 10 in the recesses are part of a connector fixation means, while the two side projections 2a of the connector 2 are engagement portions engagable with the hooks 10. Upper surfaces 20 of the projections 2a are engaging surfaces. Other portions or components of this IC card are substantially the same as those of the above-described conventional IC card.

When the connector 2 is fitted in the frame in the IC card formed as described above, the hooks 10 can be deflected outwardly in opposite directions by the projections 2a of the connector 2, as indicated by arrows in FIG. 1B, because of the oblique surfaces 10a on the hooks 10. Thereafter, the hooks 10 engage the upper surfaces 20 of the projections 2a and are restored to their original shape, thereby fixing the connector 2. Thus, the connector 2 can be easily fixed in the frame 1 by being simply inserted between the two hooks 10. It is thereby possible to prevent the connector 2 from shifting in a direction perpendicular to the card faces.

A method of manufacturing the IC card of this embodiment will be briefly described below. First, a circuit board 3 on which electronic parts are mounted is soldered to the connector 2 (soldering-fixation step). Next, the circuit board 3 and the connector 2 fixed to the circuit board 3 are fitted in the opening of the frame 1, and the circuit board 3 is fixed on the frame 1 by caulking while the connector is fixed on the frame 1 by the hooks 10 (fitting/fixation step). Panels 5 are then attached to obverse and reverse surfaces of the frame 1 by an adhesive or the like (not shown) (panel attachment step), thereby completing the IC card. In this manufacturing process, the occurrence of a defect due to shifting of the connector 2 and other failures can be reduced, so that the yield is increased and productivity is improved.

EMBODIMENT 2

Figure 2A:
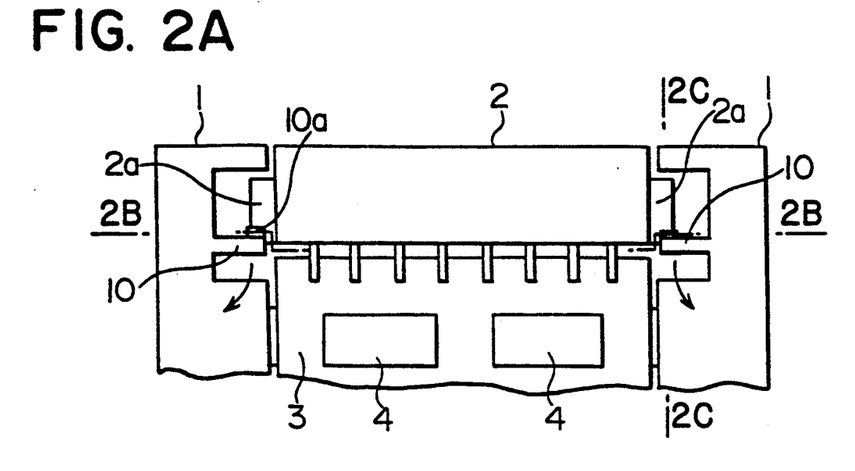
FIG. 2A is a plan view of the internal structure of a portion of an IC card in accordance with a second embodiment of the present invention.
Figure 2B:
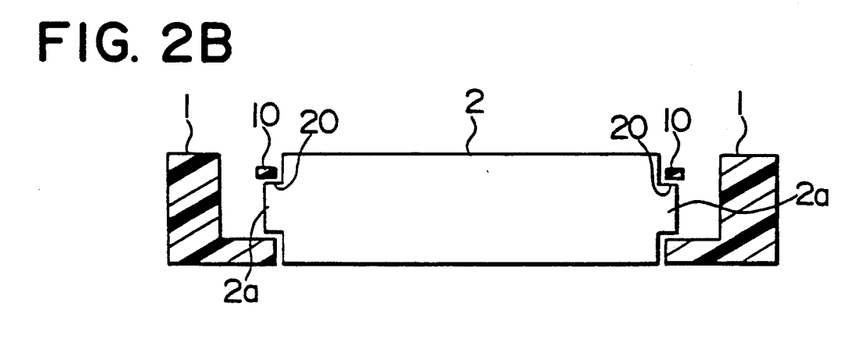
FIG. 2B is a cross-sectional view taken along the line 2B—2B of FIG. 2A.
Figure 2C:
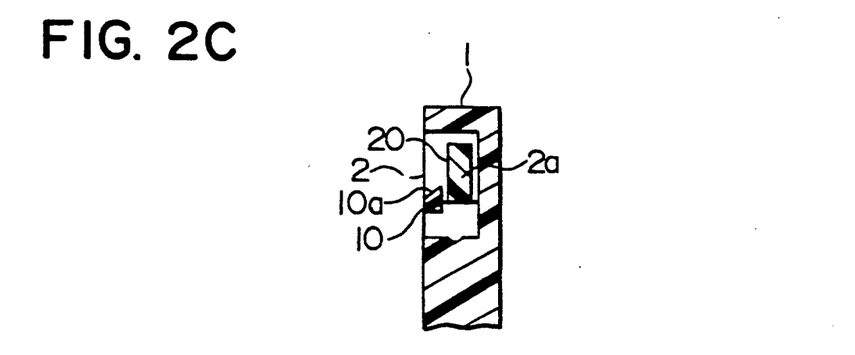
FIG. 2C is a cross-sectional view taken along the line 2C—2C of FIG. 2A.

In Embodiment 1, hooks 10 extending upwardly from a lower portion of the frame 1, that is, extending in a direction perpendicular to the card faces are provided. However, the same advantages as that of Embodiment 1 can also be achieved by providing hook 10 extending in a different direction as shown in FIGS. 2A to 2C. FIG. 2A is a plan view showing the internal construction of a portion including a connector 2 and other members of an IC card in accordance with a second embodiment of the present invention (with the panels removed), FIG. 2B is a cross-sectional view taken along the line 2B—2B of FIG. 2A, and FIG. 2C is a cross-sectional view taken along the line 2C—2C of FIG. 2A. In this embodiment, the hooks 10 extend laterally from the frame 1 toward the connector 2, and have extreme end portions extending in the card insertion direction. Gaps (recesses) receiving the projections 2a of the connector 2 and allowing the hooks 10 to be deflected are located around the hooks 10. Oblique surfaces 10a are present on the hooks 10, as shown in FIG. 2C. When the connector 2 is fitted in the frame, the hooks 10 are deflected toward the circuit board 3 as indicated by arrows in FIG. 2A by the projections 2a of the connector 2 since the oblique surfaces 10a are present on the hooks 10. The hooks 10 are thereafter brought into engagement with upper surfaces 20 of the projections 2a, as illustrated, and restored to their original shape, thereby fixing the connector 2.

EMBODIMENT 3

Figure 3A:
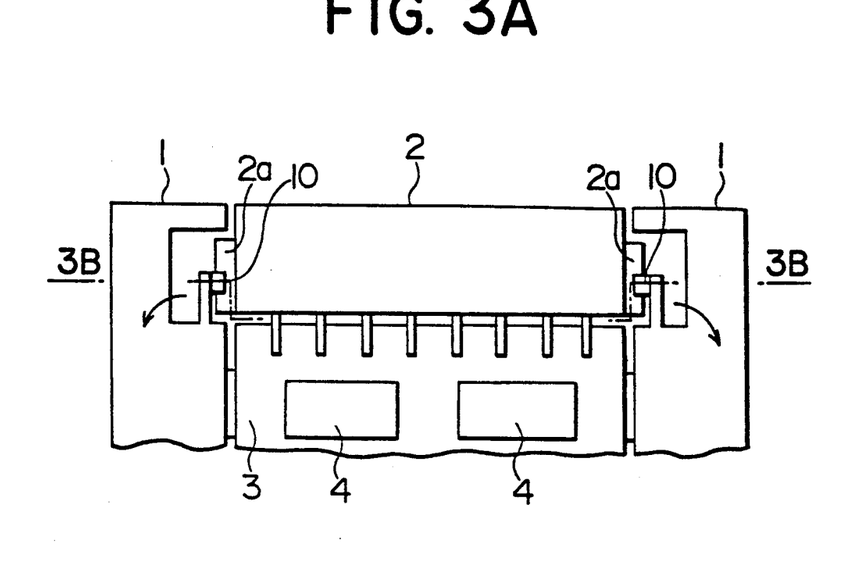
FIG. 3A is a plan view of the internal structure of a portion of an IC card in accordance with a third embodiment of the present invention.
Figure 3B:
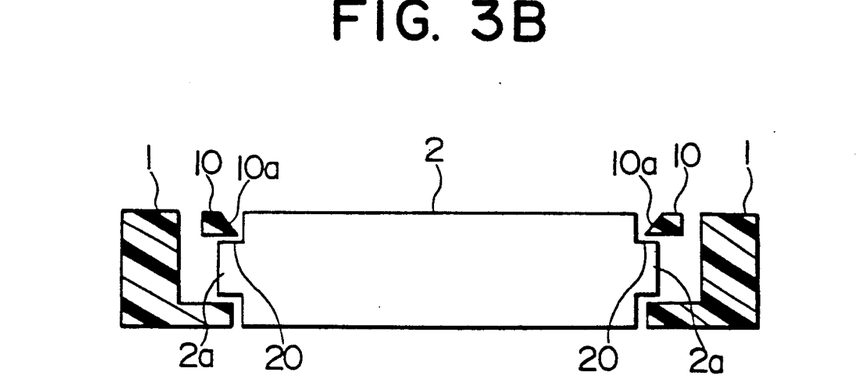
FIG. 3B is a cross-sectional view taken along the line 3B—3B of FIG. 3A.

FIGS. 3A and 3B show a third embodiment of the present invention. In this embodiment, hooks 10 extend in the card insertion direction. FIG. 3A is a plan view showing the internal construction of a portion including a connector 2 and other members of an IC card in accordance with this embodiment, and FIG. 3B is a cross-sectional view taken along the line 3B—3B of FIG. 3A. In this embodiment, the hooks 10 extend in the card insertion direction, and have extreme end portions bent toward the connector 2. Gaps (recesses) receiving the projections 2a of the connector 2 and allowing the hooks 10 to be deflected are present around the hooks 10. When the connector 2 is fitted in the frame, the hooks 10 are bent outwardly in opposite directions as indicated by arrows in FIG. 3A by being pressed by the projections 2a of the connector 2 at the oblique surfaces 10a on the hooks 10.

EMBODIMENT 4

Figure 4A:
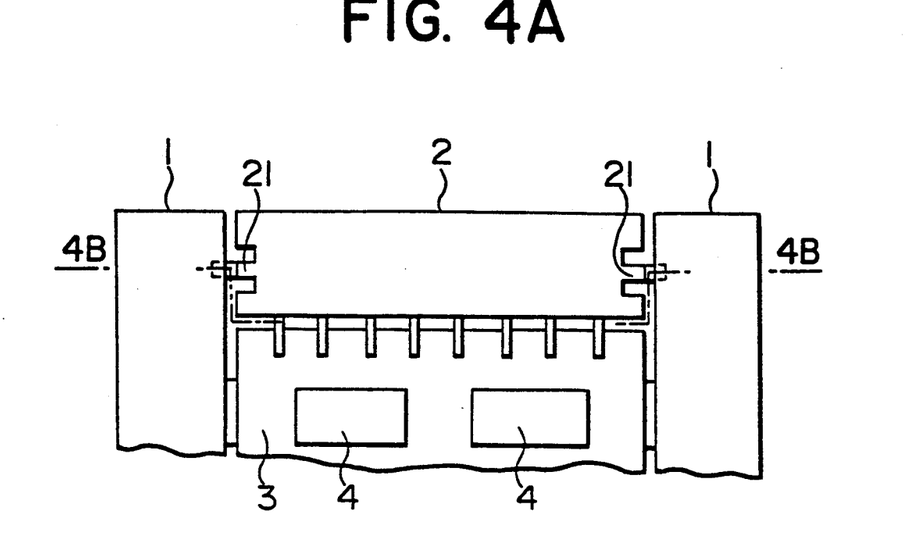
FIG. 4A is a plan view of the internal structure of a portion of an IC card in accordance with a fourth embodiment of the present invention.
Figure 4B:
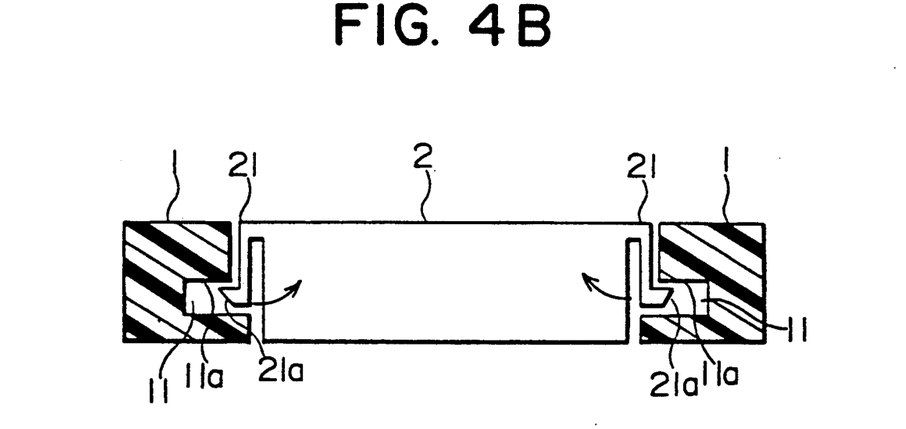
FIG. 4B is a cross-sectional view taken along the line 4B—4B of FIG. 4A.

In each of the above-described embodiments, projections are disposed on the connector while hooks are disposed on the frame. Alternatively, hooks may, conversely, be disposed on the connector. FIGS. 4A and 4B show an example of such an arrangement. FIG. 4A is a plan view showing the internal construction of a portion including a connector 2 and other members of an IC card in accordance with this embodiment, and FIG. 4B is a cross-sectional view taken along the line 6B—6B of FIG. 4A. In this embodiment, hooks 21 are disposed on side surfaces of the connector 2 on the opposite sides of an axis along card insertion direction. Engagement holes 11 are respectively disposed in frame 1 inner wall portions opposed to the hooks 21. Each hook 21 extends downward from an upper portion of the connector 2 and has an extreme end portion bent toward the frame 1. Gaps (recesses) allowing the hooks 21 to be deflected are present around the hooks 21. When the connector 2 is fitted in the frame, the hooks 21 are bent inwardly as indicated by arrows in FIG. 4B by being pressed by inner surfaces of the frame 1 at the oblique surfaces 21a on the hooks 21 (as shown in FIG. 4B). Thereafter, the hooks 21 are restored to their original shape and brought into engagement with upper surfaces 11a of the engagement holes 11, thereby fixing the connector 2 on the frame 1.

In this embodiment, the connector has no large projections, so that the engagement holes 11 in the frame 1 may be smaller than the gaps or recesses around the hooks formed on the frame in each of the above described embodiments. Therefore, it is easier to form the connector 2, and the volume occupied by the connector fixation means is smaller, so that the influence on other portions is reduced.

EMBODIMENT 5

Figure 5A:
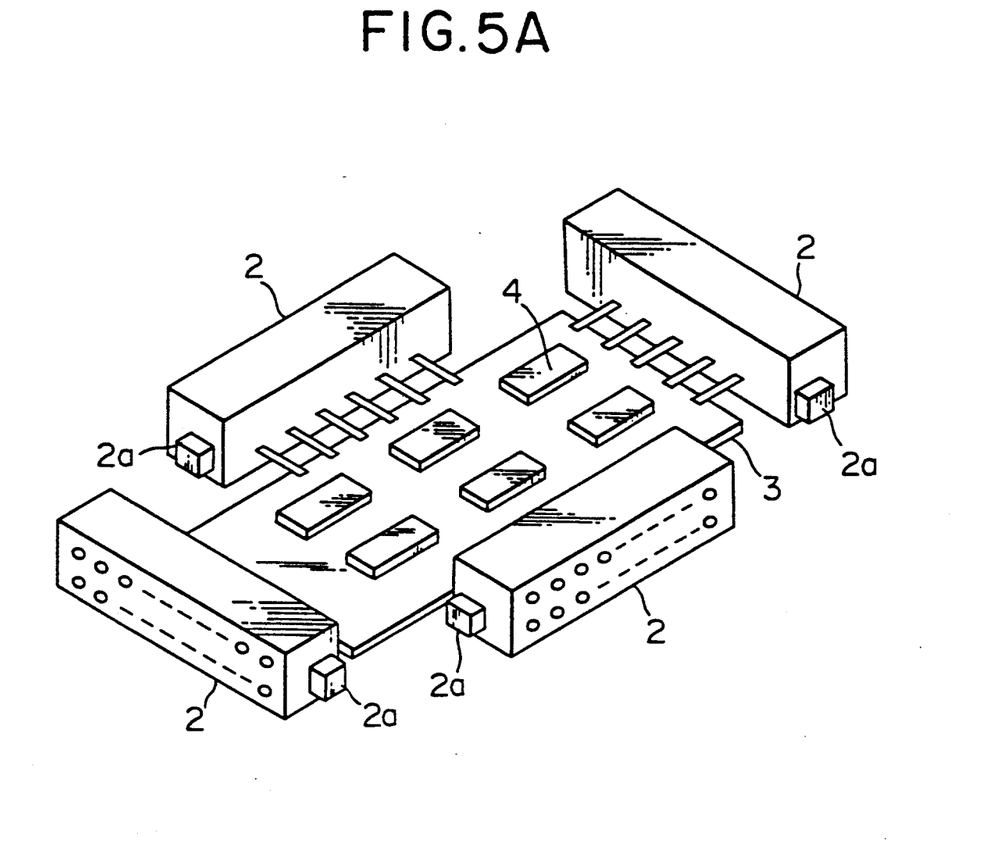
FIG. 5A is a perspective view of a circuit board and a connector of an IC card in accordance with a fifth embodiment of the present invention.
Figure 5B:
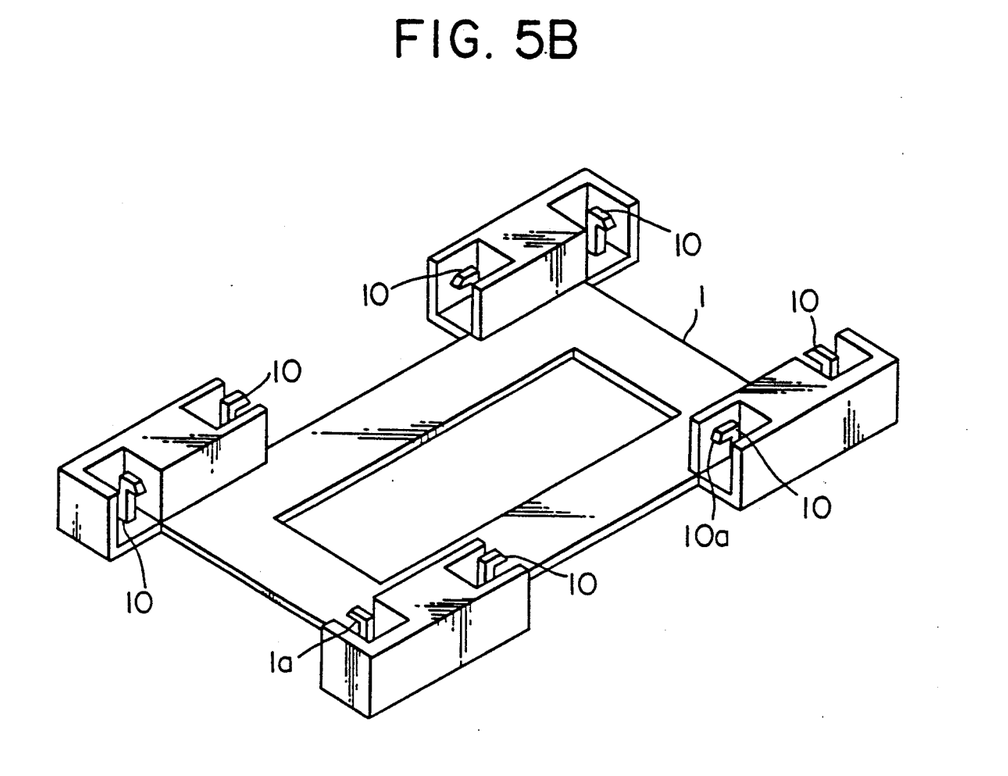
FIG. 5B is a perspective view of a frame of the card shown in FIG. 5A.

Some IC cards are designed so as to have a plurality of connectors in conformity with the configurations of external unit connectors. FIGS. 5A and 5B show a fifth embodiment in which the present invention is applied to such an IC card. FIG. 5A is a perspective view of a circuit board 3 having four sides to which each of which a connector 2 is connected and fixed, and FIG. 5B is a perspective view of a frame 1 for accommodating the circuit board 3 with the four connectors shown in FIG. 5A. In this embodiment, a pair of hooks 10 are formed on the frame 1 with respect to each connector 2. The hooks 10 are the same as those shown in FIGS. 1A and 1B. When the circuit board 3 on which the four connectors 2 are fixed is fitted in the frame 1, the connectors 2 are fixed to the frame 1 by the hooks 10. This arrangement, enabling the connectors 2 to be assembled by being simply fitted, facilitate the assembly operation in a process for manufacturing the card.

The number of connectors 2 is not limited to four. Also, the shape of the hooks 10 is not limited to that illustrated in FIGS. 1 and 5. For example, the hooks may be formed as in the same manner as in the embodiments shown in FIGS. 2A to 2C, 3A and 3B, or 4A and 4B.

Figure 6A:
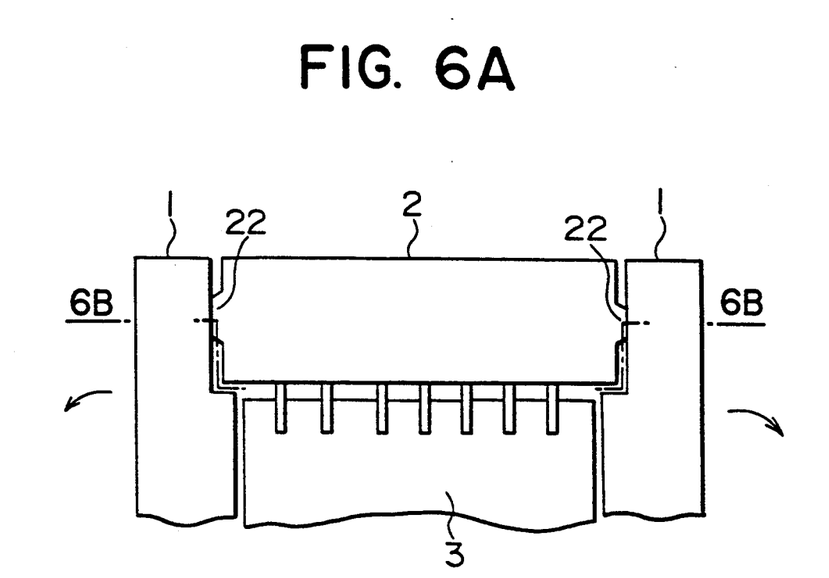
FIG. 6A is a plan view of the internal structure of a portion of an IC card in accordance with a sixth embodiment of the present invention.
Figure 6B:
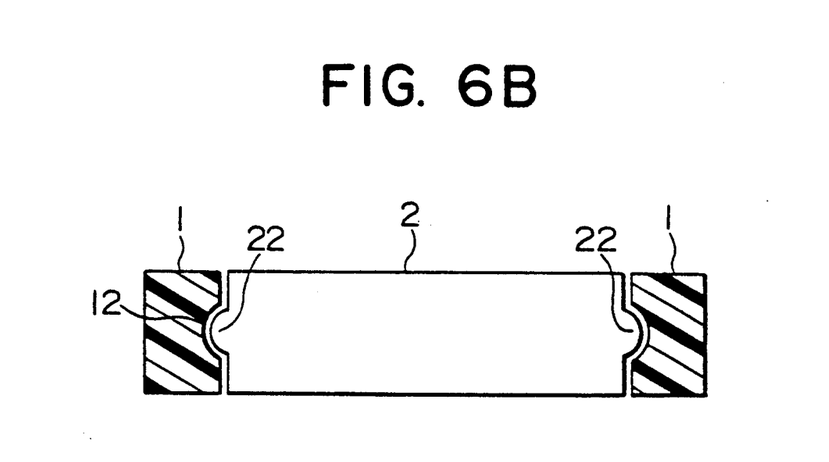
FIG. 6B is a cross-sectional view taken along the line 6B—6B of FIG. 6A.

FIGS. 6A and 6B show an IC card in accordance with a sixth embodiment of the present invention. FIG. 6A is a plan view showing the internal construction of a portion including a connector 2 and other members (with the panels removed), and FIG. 6B is a cross-sectional view taken along the line 6B—6B of FIG. 6A. In this embodiment, raised portions 22 are disposed on side surfaces of the connector 2 on the opposite sides of an axis along the card insertion direction, while recesses 12 for receiving the raised portions 22 are located in frame 1 inner wall portions opposed to the raised portions 22. In this embodiment, when the connector 2 is fitted in the frame 1, the side portions of the frame 1 between which the connector 2 is fitted are extended outwardly by the raised portions 22 of the connector 2, as indicated by arrows in FIG. 6A. Thereafter, when the raised portions 22 are fitted in the recesses 12 as illustrated, the frame 1 is restored to its original shape to fix the connector 2 on the frame 1. Therefore, the frame 1 is formed of an elastic resin or plastic. A crosspiece (such as one indicated at 1b in FIG. 10A) is not provided the frame 1 in the vicinity of the connector 2. The raised portions 22 able to slide easily on the inner surfaces of the frame 1. Preferably, the raised portions 22 have, for example, a round shape, as illustrated.

Conversely relative to this arrangement, the recesses may be disposed in the connector 2 while raised portions are located on the frame 1 to obtain the same advantages.

EMBODIMENT 7

Figure 7A:
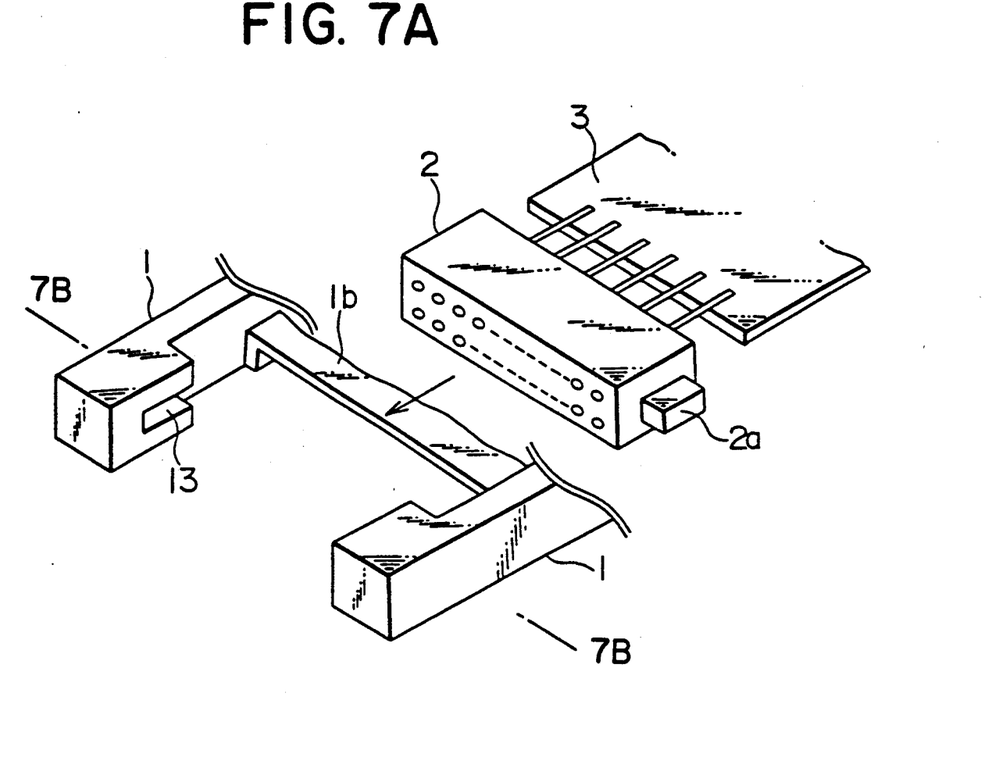
FIG. 7A is a perspective view of the internal structure of a portion of an IC card in accordance with a seventh embodiment of the present invention.
Figure 7B:
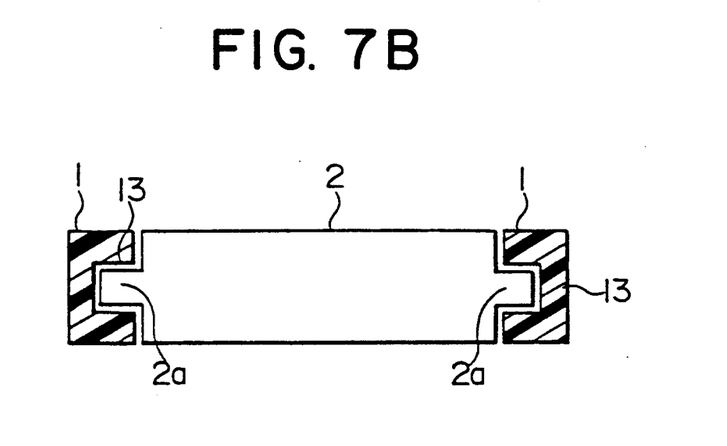
FIG. 7B is a cross-sectional view taken along the line 7B—7B of FIG. 6A.

FIGS. 7A and 7B show the seventh embodiment of the present invention. FIG. 7A is a perspective view showing the internal construction of a portion including a connector 2 and other members (with the panels), and FIG. 7B is a cross-sectional view taken along the line 7B—7B of FIG. 7A. In this embodiment, projections 2a are located on side surfaces of the connector 2 on the opposite sides of an axis along the card insertion direction, while grooves 13 are in frame 1 inner wall portions opposed to the projections 2a so that projections 2a can be fitted in the grooves 13 in a sliding manner. In this embodiment, when the connector 2 is fitted in the frame 1, the connector 2 slides into the frame 1 until the projections 2a and the grooves are fitted, as indicated by an arrow in FIG. 7A, thereby fixing the connector 2 on the frame 1.

EMBODIMENT 8

Figure 8A:
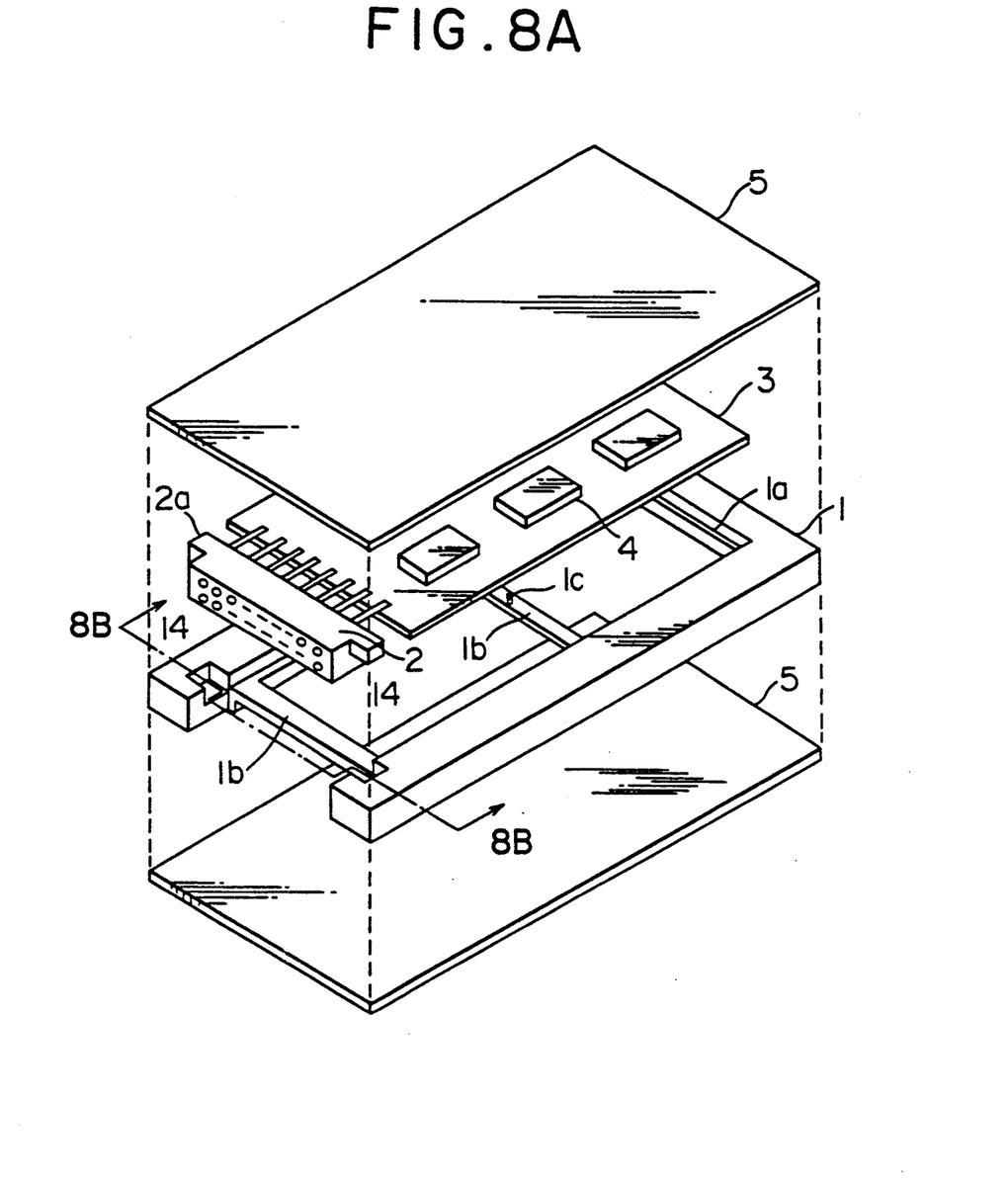
FIG. 8A is an exploded perspective view of the internal structure of an IC card in accordance with an eighth embodiment of the present invention.
Figure 8B:
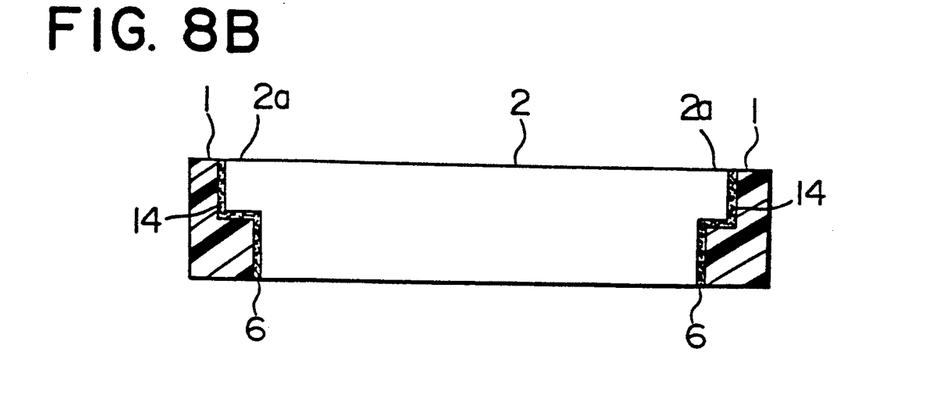
FIG. 8B is a cross-sectional view taken along the line 8B—8B of FIG. 8A.

FIGS. 8A and 8B show an IC card in accordance with an eighth embodiment of the present invention. FIG. 8A is an exploded perspective view showing the internal construction of the IC card, and FIG. 8B is a cross-sectional view taken along the line 8B—8B of FIG. 8A. In this embodiment, projections 2a are located on upper portions of two side portions of a connector 2 on the opposite sides of an axis along the card insertion direction. Receiving portions 14 in which the projections 2a are fitted are located in frame 1 inner wall portions opposed to the projections 2a. In this embodiment, when the connector 2 is fitted in the frame 1, the projections 2a fitted in the receiving portions 14 of the frame 1 are fixed by an adhesive 6. The connector 2 is thereby firmly fixed on the frame 1.

There are some conventional IC cards in which a lower surface of a main body of a connector is bonded to a frame by an adhesive. In this embodiment, however, the projections 2a and the receiving portions 14 located at the opposite sides of the connector 2 are bonded by adhesive 6, and therefore there is no need to extend the frame under the connector. It is therefore possible to fix the connector without any considerable influence upon the main body of the connector.

EMBODIMENT 9

Figure 9A:
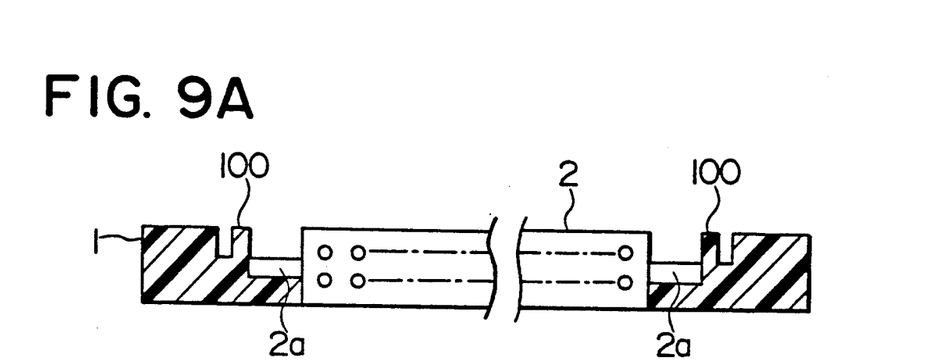
FIG. 9A is a cross-sectional view of an IC card in accordance with a ninth embodiment of the present invention, showing connector and other members before engaging/fixing portions are bent.
Figure 9B:
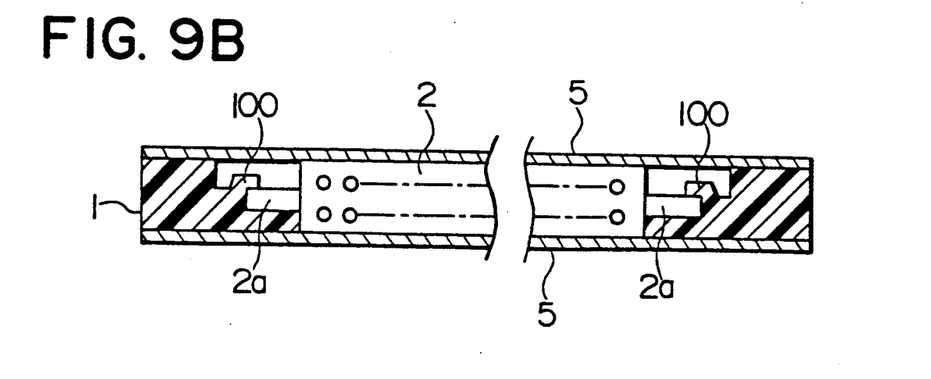
FIG. 9B is a cross-sectional view of the IC card shown in FIG. 9A, showing the connector and other members when the IC card is completed.

FIGS. 9A and 9B show an IC card in accordance with a ninth embodiment of the present invention. In this IC card, deformable portions 100 are located on frame 1 portions for receiving projections 2a on opposite side surfaces of a connector 2. These two side deformable portions 100 are upright approximately perpendicular to the card faces, as shown in FIG. 9A. Each deformable portion 100 is formed of a deformable material. If the deformable portions 100 are formed of the same material as the frame 1, e.g., a resin or the like, they are deformed by heat, and/or a force applied thereto. In this case the deformable portions 100 can be formed integrally with the frame 1. After the connector 2 has been fitted in the frame 1, the deformable portions 100 are bent to the upper surfaces of the projections 2a by being deformed by the above-mentioned means. The connector 2 is thereby fixed on the frame 1, and is prevented from shifting in a direction perpendicular to the card faces. Thereafter, panels 5 are attached to the frame 1, thereby completing the card.

In accordance with the present invention, as described above, a connector fixation means for fixing the connector on the frame so as to prevent the connector from shifting is provided. The connector can be easily fixed firmly in any direction. The possibility of occurrence of a product defect or manufacturing failure during the manufacturing produce is thereby reduced, thereby making it possible to obtain IC cards improved in reliability.

In the IC card manufacturing method in accordance with the present invention, when the circuit board and the connector are assembled in the frame, the circuit board is fixed on the frame by caulking and the connector is simultaneously connected to the frame by the above-mentioned connector fixation means, so that product defects or manufacturing failures caused by a shifting of the connector during the manufacturing process is reduced, thereby increasing the yield and improving productivity. Only fitting the connector in a predetermined position on the frame will suffice as the operation for fixing the connector on the frame, thus facilitating assembly.

What is claimed is:

1. An IC card for insertion into and connection to an external unit, said IC card comprising:
    a circuit board having a major surface and at least one edge;
    electronic parts mounted on the major surface;
    at least one connector fixed on the edge of said circuit board and electrically connected to said electronic parts;
    a frame receiving said circuit board and said connector, laterally surrounding said circuit board and said connector with said circuit board fixed to said frame and a face of said connector exposed;

connector fixation means fixing said connector to said frame; and a pair of panels attached to obverse and reverse surfaces of said frame, covering said circuit board and said connector.

2. The IC card according to claim 1 wherein said connector fixation means comprises resilient hooks on opposite sides of said connector and a pair of engagement portions on said frame engaging said hooks, wherein, when said connector is being fitted into said frame, said hooks are temporarily deflected by said connector and thereafter restored to their original shape to engage said engagement portions and fix said connector on said frame.

3. The IC card according to claim 2 wherein said engagement portions comprise projections and said connector fixation means comprises gaps in said frame receiving said projections and surrounding said hooks.

4. The IC card according to claim 1 wherein said frame is resilient and said connector fixation means comprises recesses in sides of said connector and a pair of projections on said frame engageable with said recesses, wherein, when said connector is being fitted in said frame, said frame is temporarily deflected outwardly and then restored to its original shape by the fitting into the recesses of said projections fixing said connector on said frame.

5. The IC card according to claim 1 wherein said connector fixation means comprises projections on said connector and a groove in said frame opposed to said projections, wherein, when said connector is being fitted in said frame, said connector slides to fit said projections into the grooves to fix said connector on said frame.

6. The IC card according to claim 1 wherein said connector fixation means comprises projections on said connector, receiving portions in said frame opposed to said projections, and an adhesive bonding said projections to said receiving portions.

7. The IC card according to claim 1 wherein said connector fixation means comprises projections on said connector, gaps in said frame opposed to and receiving said projections, and deformable portions surrounded by said gaps and deformed to fix said connector on said frame after fitting of said connector into said frame.

8. The IC card according to claim 2 wherein said connector fixation means comprises hooks on sides of said connector and said engagement portions comprise engagement holes in said frame opposed to said hooks.

9. The IC card according to claim 2 wherein said circuit board includes a plurality of edges including a plurality of said connectors, each connector being disposed on a respective edge of said circuit board and including connector fixation means for fixing each connector.

10. A method of manufacturing an IC card having a frame, a circuit board on which electronic parts are mounted, a connector electrically connected to the electronic parts, and panels attached to opposite surface of the frame, the circuit board and the connector being accommodated in said frame, said method comprising:

fixing the connector on the circuit board by soldering;

fitting in the frame the circuit board on which the connector is fixed, fixing the circuit board on the frame by caulking, and fixing the connector on the frame with connector fixation means; and attaching the panels to the opposite surfaces of the frame.

* * * * *